United States Patent
Wu et al.

(10) Patent No.: US 8,741,732 B2
(45) Date of Patent: Jun. 3, 2014

(54) FORMING METAL-INSULATOR-METAL CAPACITORS OVER A TOP METAL LAYER

(71) Applicant: Taiwan Semiconductor Manufacturing Company, Ltd., Hsin-Chu (TW)

(72) Inventors: Kun-Mao Wu, Pingzhen (TW); Chih-Hsun Lin, Tainan (TW); Yu-Lung Yeh, Kaohsiung (TW); Kuan-Chi Tsai, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/045,976

(22) Filed: Oct. 4, 2013

(65) Prior Publication Data

US 2014/0038384 A1 Feb. 6, 2014

Related U.S. Application Data

(63) Continuation of application No. 13/007,777, filed on Jan. 17, 2011, now Pat. No. 8,552,486.

(51) Int. Cl.
*H01L 21/20* (2006.01)
*H01L 27/108* (2006.01)
*H01L 49/02* (2006.01)

(52) U.S. Cl.
CPC .......... *H01L 27/10852* (2013.01); *H01L 28/40* (2013.01)
USPC ....................................................... 438/396

(58) Field of Classification Search
CPC ........................ H01L 27/10852; H01L 28/40
USPC ............................................................ 438/396
See application file for complete search history.

(56) References Cited

U.S. PATENT DOCUMENTS

| | | | |
|---|---|---|---|
| 6,150,689 A | 11/2000 | Narui et al. | |
| 6,617,666 B2 | 9/2003 | Yoshitomi et al. | |
| 6,864,137 B2 | 3/2005 | Yoshitomi et al. | |
| 7,397,107 B2 | 7/2008 | Brennan et al. | |
| 7,586,143 B2 | 9/2009 | Watanabe | |
| 2005/0082592 A1* | 4/2005 | Chang et al. | 257/306 |
| 2006/0281300 A1* | 12/2006 | Yaegashi | 438/622 |
| 2007/0235790 A1 | 10/2007 | Kim et al. | |

FOREIGN PATENT DOCUMENTS

CN 1374699 A 10/2002

* cited by examiner

*Primary Examiner* — Phat X Cao
(74) *Attorney, Agent, or Firm* — Slater and Matsil, L.L.P.

(57) ABSTRACT

A plurality of metal layers includes a top metal layer. An Ultra-Thick Metal (UTM) layer is disposed over the top metal layer, wherein no additional metal layer is located between the UTM layer and the top metal layer. A Metal-Insulator-Metal (MIM) capacitor is disposed under the UTM layer and over the top metal layer.

20 Claims, 9 Drawing Sheets

FORMING METAL-INSULATOR-METAL CAPACITORS OVER A TOP METAL LAYER

This application is a continuation of U.S. patent application Ser. No. 13/007,777, entitled "Forming Metal-Insulator-Metal Capacitors over a Top Metal Layer," filed on Jan. 17, 2011, which application is incorporated herein by reference.

BACKGROUND

Metal-Insulator-Metal (MIM) capacitors have been widely used in functional circuits such as mixed-signal circuits, analog circuits, radio frequency (RF) circuits, dynamic random access memories (DRAMs), embedded DRAMs, and logic operation circuits. Conventional MIM capacitors were formed in interconnect structures. Since the interconnect structures include copper lines and copper vias formed of damascene processes, the formation of conventional MIM capacitors was integrated with the damascene processes. For example, a bottom electrode of a MIM capacitor may be formed in one of the metal layers in the interconnect structure, while the top electrode of the MIM capacitor may be formed between two metal layers.

Conventional MIM capacitors are formed at the same level as the via layers connecting overlying and underlying metal layers. As a result, no metal line can be routed in the metal layer immediately under the MIM capacitors and in the regions vertically overlapping the MIM capacitors. Otherwise, the capacitance values of the MIM capacitors may be adversely affected by the parasitic capacitors between the MIM capacitors and the nearby metal lines.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel integrated circuit structure including Metal-Insulator-Metal (MIM) capacitors and the method of forming the same are provided in accordance with an embodiment. The intermediate stages of manufacturing various embodiments are illustrated. The variations of the embodiment are discussed. Throughout the various views and illustrative embodiments, like reference numbers are used to designate like elements.

Figure 1:
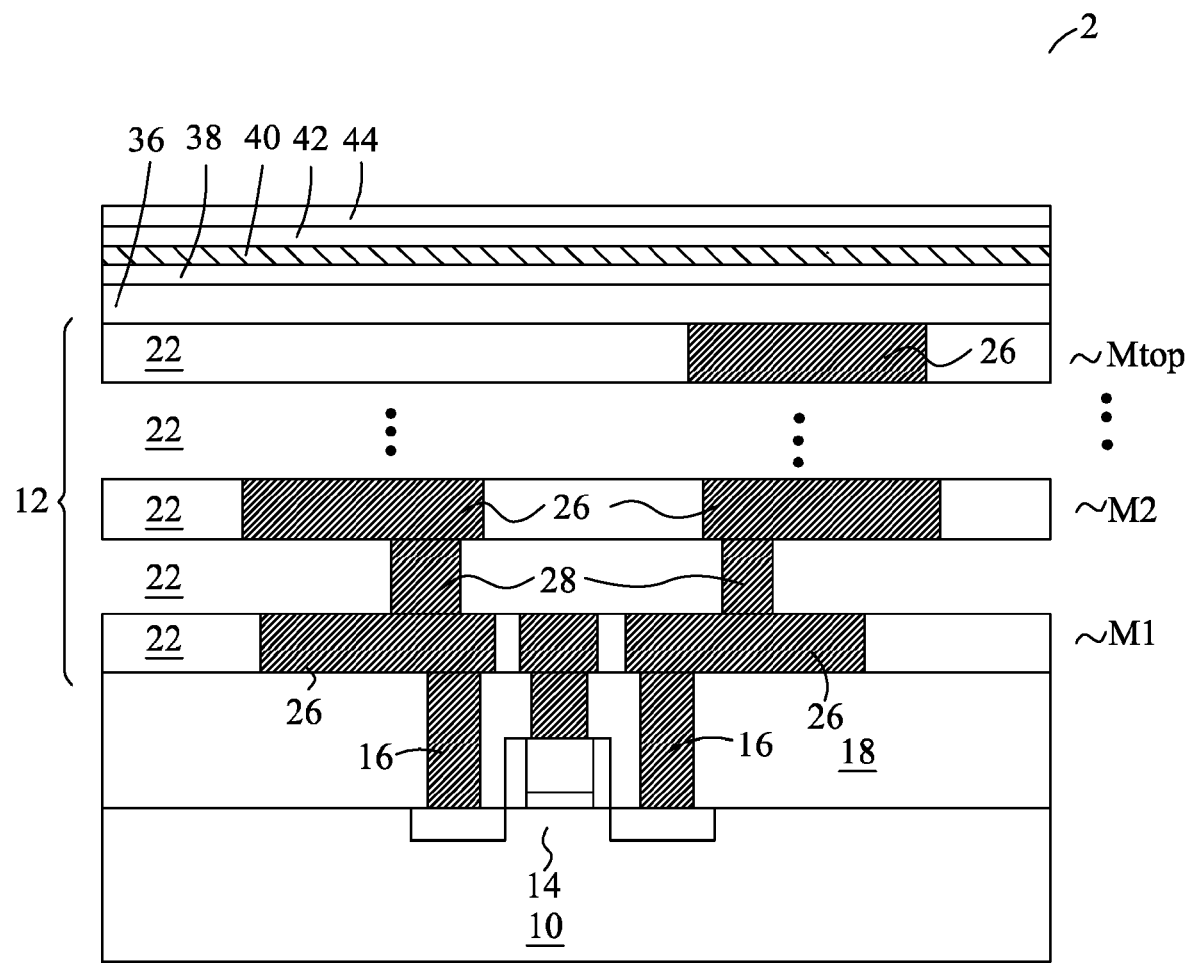
FIGS. 1 through 8 are cross-sectional views of intermediate stages in the manufacturing of an integrated circuit structure comprising a Metal-Insulator-Metal (MIM) capacitor in accordance with various embodiments.

Referring to FIG. 1, wafer 2 is provided. Wafer 2 includes substrate 10. In an embodiment, substrate 10 is a semiconductor substrate, such as a silicon substrate, although it may include other semiconductor materials, such as silicon germanium, silicon carbide, gallium arsenide, or the like. Semiconductor devices 14, which are symbolized using a transistor, may be formed at a surface of substrate 10. In alternative embodiments, substrate 10 is a dielectric substrate, and no active devices are formed on the dielectric substrate, although passive devices such as capacitors, inductors, resistors, and the like may be formed. Contact plugs 16 are formed in inter-layer dielectric (ILD) 18, and may be electrically coupled to devices 14.

Figure 7:
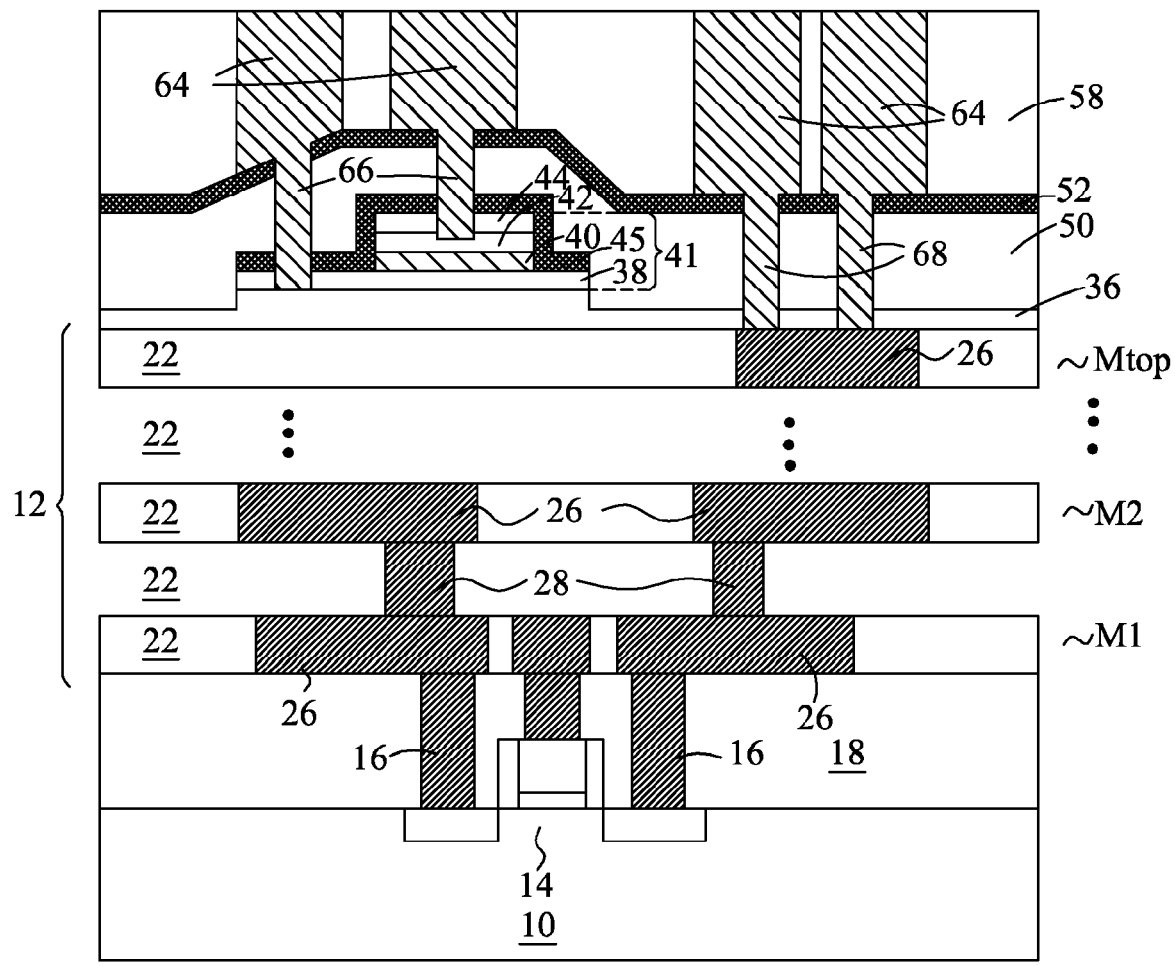

Interconnect structure 12, which includes metal lines 26 and vias 28 therein and electrically coupled to semiconductor devices 14, is formed over ILD 18. Metal lines 26 and vias 28 may be formed of substantially pure copper (for example, with a weight percentage of copper being greater than about 90 percent, or greater than about 95 percent) or copper alloys, and may be formed using the single and/or dual damascene processes. Metal lines 26 and vias 28 may be, or may not be, substantially free from aluminum. Interconnect structure 12 includes a plurality of metal layers, namely M1, M2 . . . Mtop, wherein metal layer M1 is the metal layer immediately above ILD 18, while metal layer Mtop is the top metal layer that is immediately under the overlying UTM lines 64 (not shown in FIG. 1, please refer to FIG. 7), which are formed in subsequent steps. Throughout the description, the term "metal layer" refers to the collection of the metal lines in the same layer. Metal layers M1 through Mtop are formed in inter-metal dielectrics (IMDs) 22, which may be formed of oxides such as Un-doped Silicate Glass (USG), Fluorinated Silicate Glass (FSG), low-k dielectric materials, or the like. The low-k dielectric materials may have k values lower than 3.8, although the dielectric materials of IMDs 22 may also be close to 3.8. In some embodiments, the k values of the low-k dielectric materials are lower than about 3.0, and may be lower than about 2.5.

In the following discussed embodiments, the top metal layer Mtop may be metal layer M5, although in other embodiments, a metal layer higher than or lower than M5 may be the Mtop layer. Furthermore, in exemplary embodiments, metal layer M1 may have a thickness between about 2.0 kÅ and about 3.5 kÅ, and metal layer layers M2 through Mtop may have thicknesses between about 3.0 kÅ and about 4.0 kÅ. It is realized, however, that the dimensions recited throughout the description are merely examples, and may be changed in alternative embodiments.

After the formation of layer Mtop, a plurality of layers including layers 36, 38, 40, 42, and 44 are formed. Etch stop layer 36 is formed over, and may contact, metal lines 26 in metal layer Mtop. Etch stop layer 36 may be formed of silicon nitride, for example, although other dielectric materials may be used. In an embodiment, etch stop layer 36 has a thickness between about 100 Å and about 2000 Å. Next, capacitor bottom metal (CBM, also referred to as a bottom electrode) layer 38 is formed over etch stop layer 36, followed by the formation of capacitor insulator layer 40, capacitor top metal (CTM, also referred to as a top electrode) layer 42, and the optional dielectric layer 44. Capacitor insulator layer 40 may be formed of silicon oxide, for example, or other applicable dielectric materials. CBM layer 38 and CTM layer 42 may be formed of materials including copper, aluminum, tungsten, and/or additional metals and metal alloys. Dielectric layer 44 may comprise silicon oxynitride or other materials. It is realized that each of the illustrated layers 36, 38, 40, 42 and 44 may be a homogeneous layer, or may be a composite layer including a plurality of sub-layers that are formed of different materials.

Figure 2:
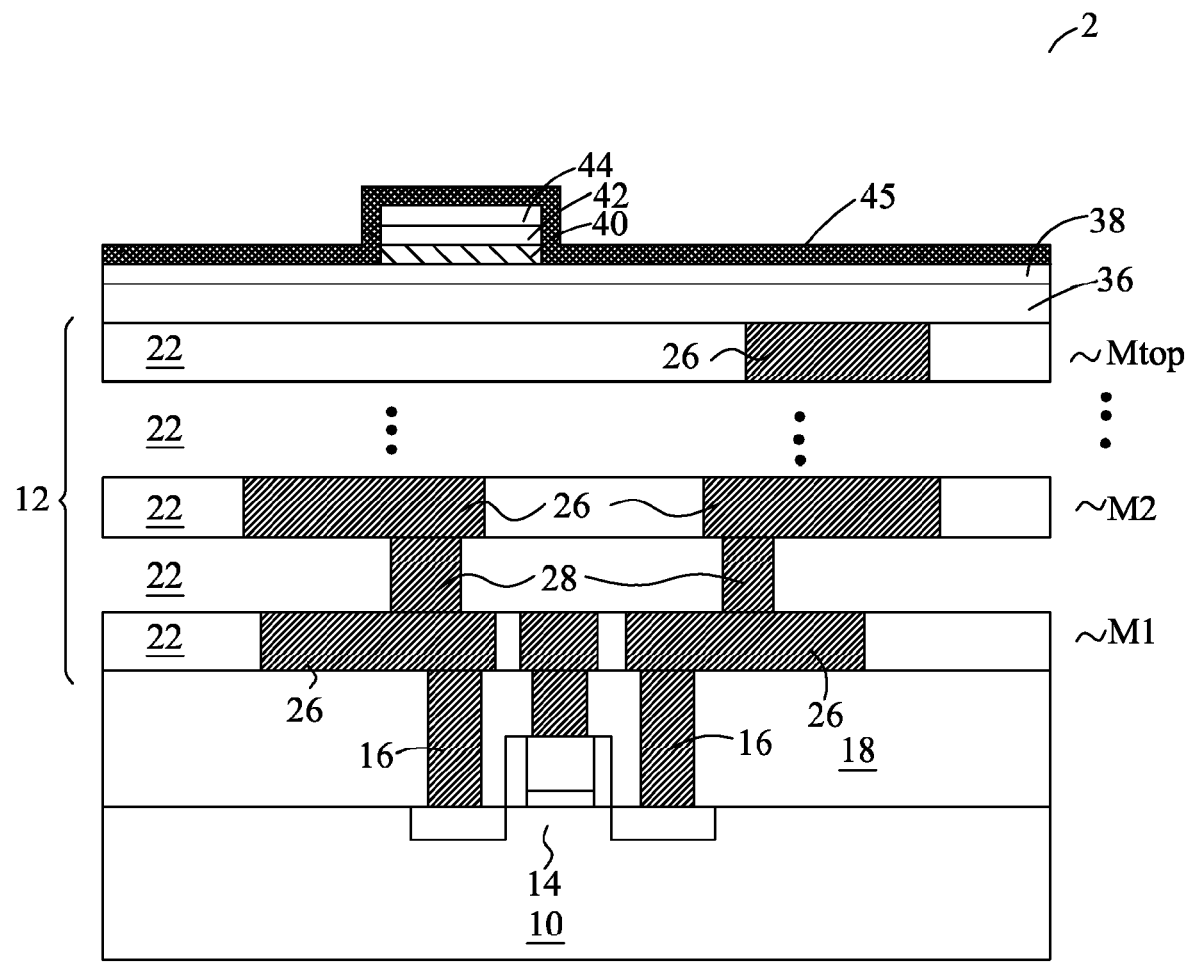
Figure 3:
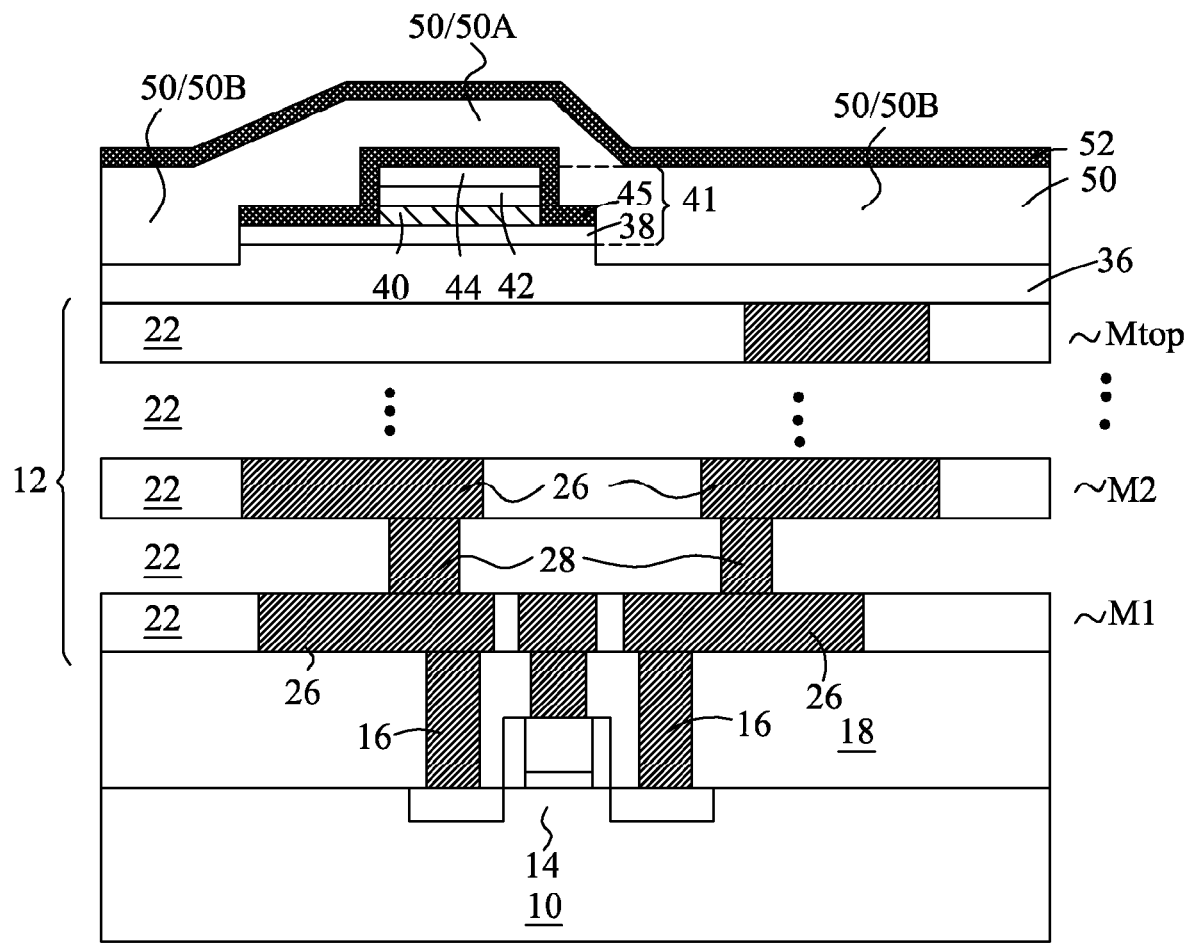

Next, as shown in FIG. 2, layers 44 and 42, and optionally capacitor insulator layer 40 as shown in FIG. 1 are patterned, so that the pattern of the CTM of the resulting MIM capacitor is defined. The resulting CTM is also denoted as 42. Etch stop layer 45 is then blanket formed to cover the patterned structure. Next, as shown in FIG. 3, etch stop layer 36 and CBM layer 38 are patterned to define the pattern for the CBM (also denoted as 38) of the resulting MIM capacitor. In the resulting structure, optional dielectric layer 44, CTM 42, capacitor insulator 40, and CBM 38 form MIM capacitor 41.

FIG. 3 also illustrates the formation of via-dielectric layer 50. First, via-dielectric layer 50 is deposited, followed by the deposition of etch stop layer 52. In an embodiment, via-dielectric layer 50 is formed of an oxide such as Un-doped Silicate Glass (USG), Fluorinated Silicate Glass (FSG), a low-k oxide, or the like. Etch stop layer 52 may be formed of silicon nitride or another dielectric material. As a result of the blanket deposition, the portions (denoted as 50A) of via-dielectric layer 50 and etch stop layer 52 that are directly over, and vertically overlapping, MIM capacitor 41 are higher than the portions (denoted as 50B) of the portions of via-dielectric layer 50 and etch stop layer 52 that are vertically misaligned to MIM capacitor 41. In an embodiment, via-dielectric layer 50 has a thickness between about 2 kÅ and about 20 kÅ.

Figure 4:
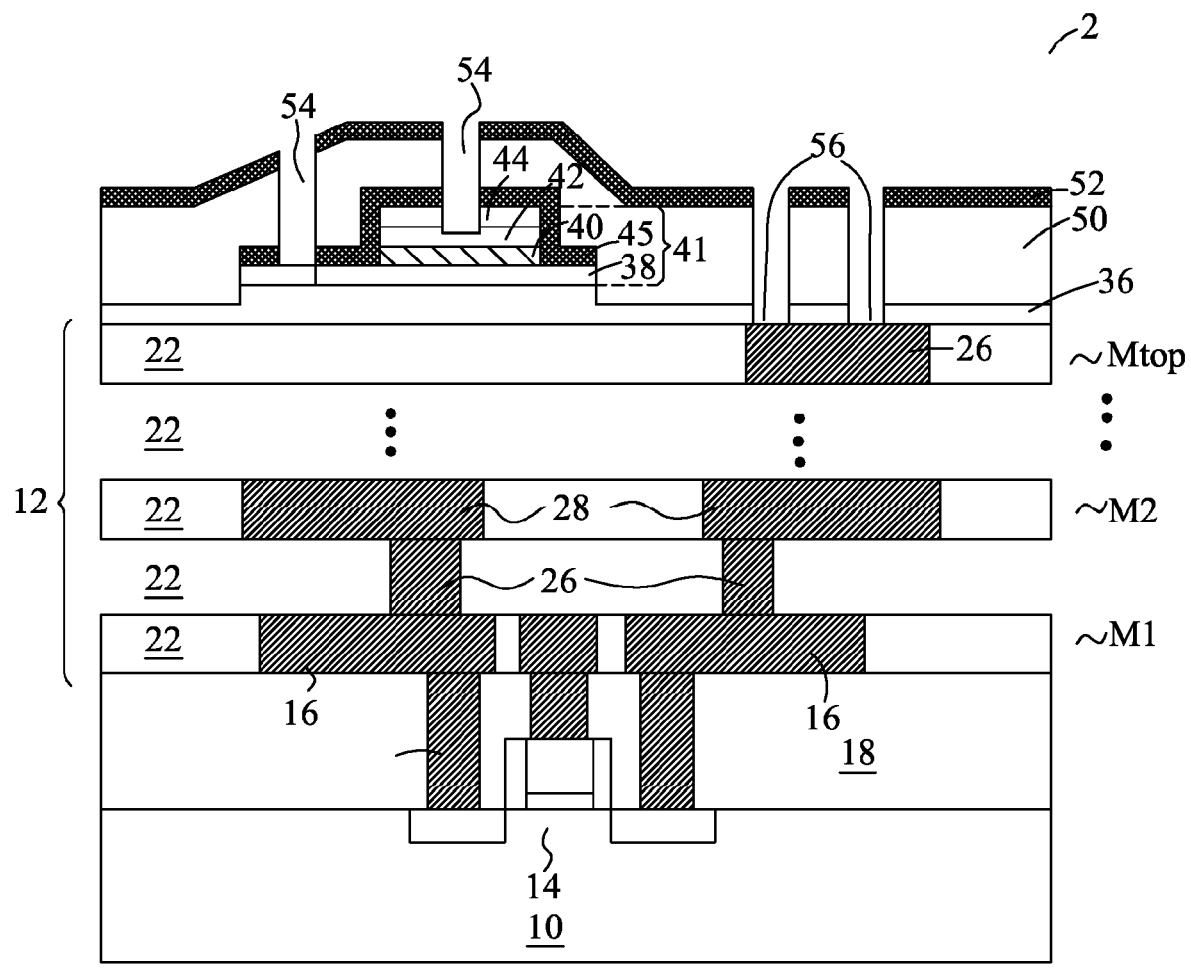

Referring to FIG. 4, etch stop layer 52 and via-dielectric layer 50 are patterned, followed by the etching of etch stop layers 36 and 45 and dielectric layer 44. As a result, capacitor contact openings 54 and via openings 56 are formed.

Figure 5:
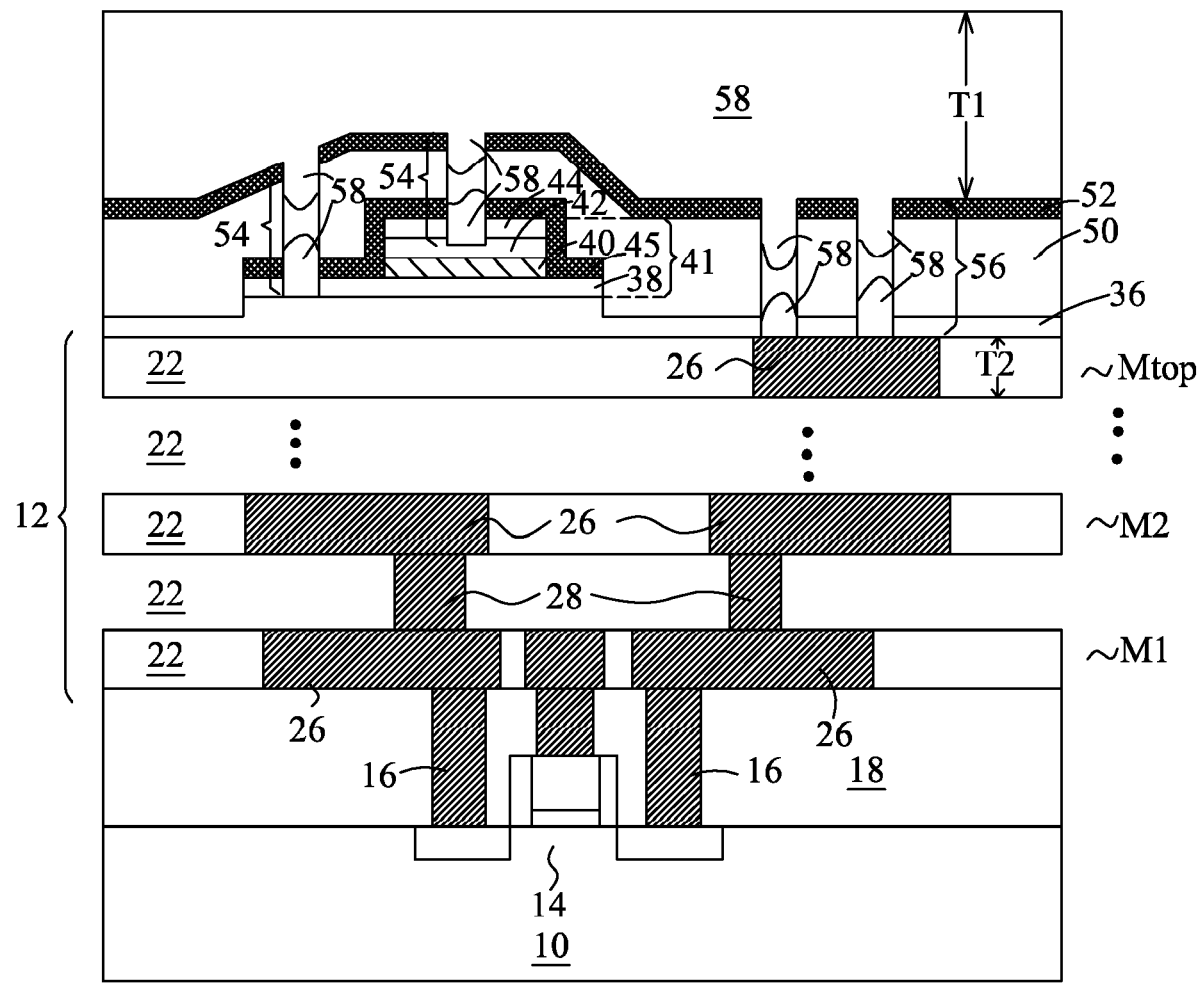

FIG. 5 illustrates the formation of UTM dielectric 58. UTM dielectric 58 may be formed of USG, FSG, Low-K material, or the like. Thickness T1 of UTM dielectric 58 may be significantly greater than thickness T2 of metal layer Mtop. In an embodiment, ratio T1/T2 is greater about 3, greater than about 5, or greater than about 10. Ratio T1/T2 may also be between about 8 and about 12. Thickness T1 may be greater than about 20 kÅ (hence the respective metal lines are referred to as ultra-thick metal lines), and may be greater than about 30 kÅ, or even greater than about 40 kÅ. In some embodiments, thickness T1 is between about 25 kÅ and about 40 kÅ. During the formation of UTM dielectric 58, the material of UTM dielectric 58 may also fall into capacitor contact openings 54 and via openings 56.

Figure 6:
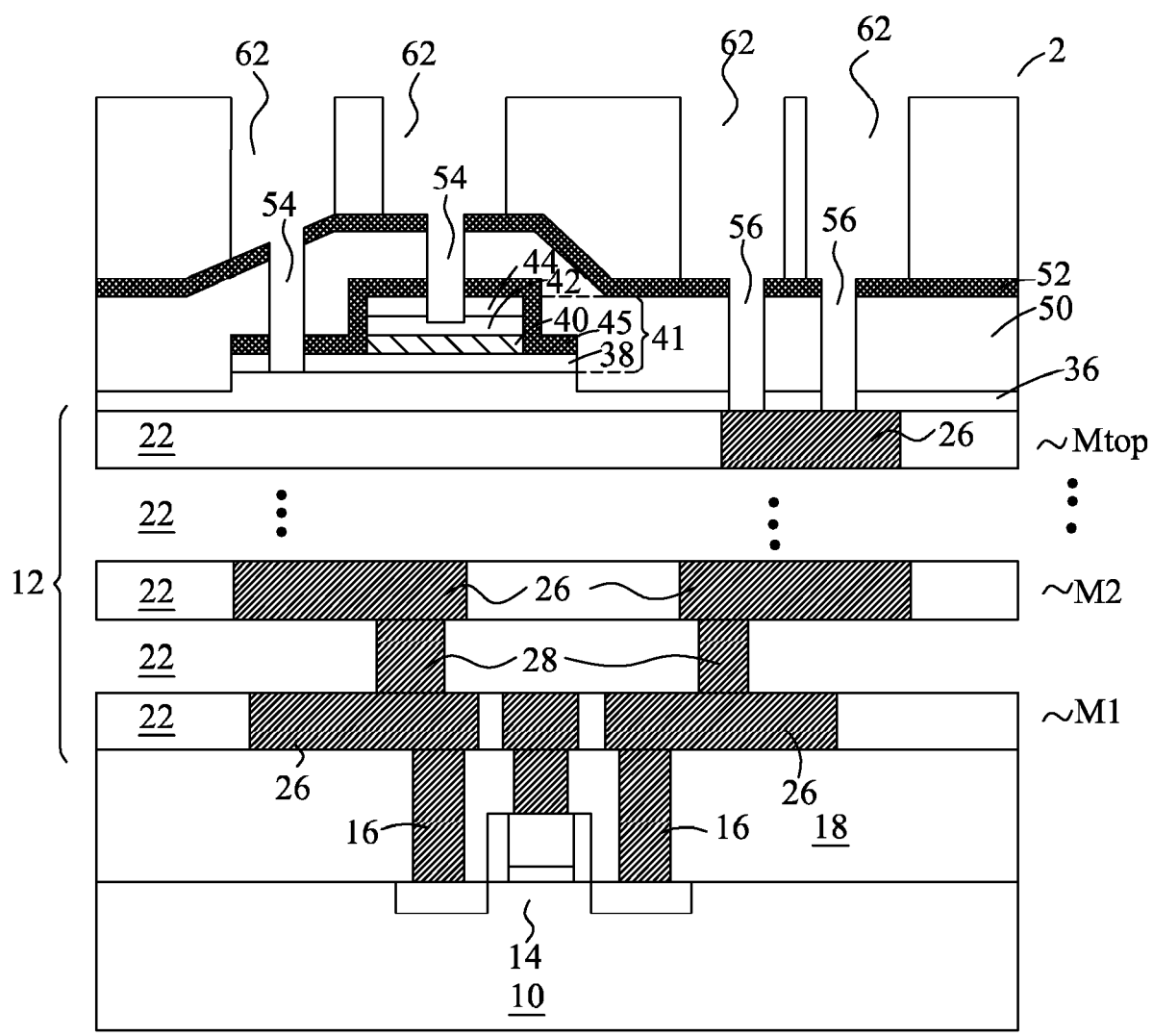
Figure 9:
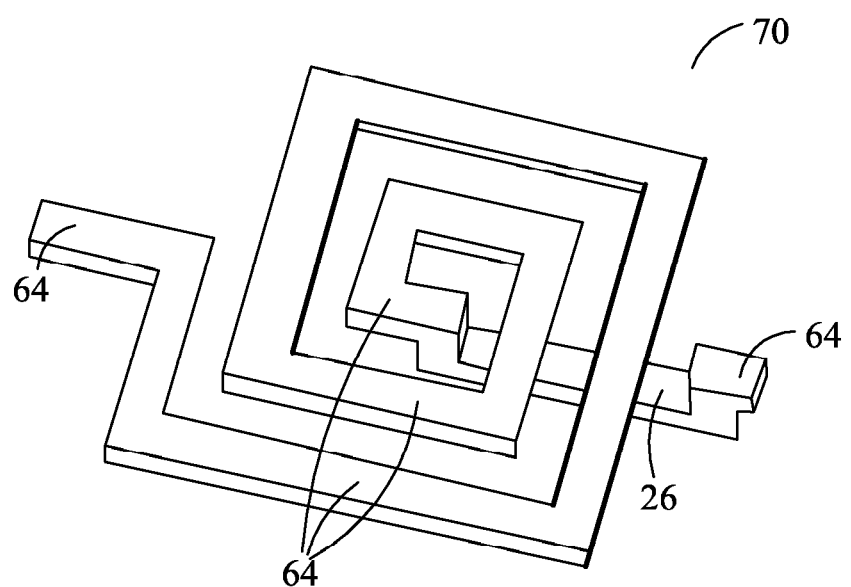
FIG. 9 illustrates a perspective view of an inductor formed in an ultra-thick metal layer.

Referring to FIG. 6, UTM openings 62 are formed through the patterning of UTM dielectric 58. The dielectric material in capacitor contact openings 54 and via openings 56 are also removed. In a subsequent step, a metallic material, which may comprise copper or a copper alloy, is filled into openings 62. Next, as shown in FIG. 2, a planarization such as a chemical mechanical polish (CMP) is performed to remove the excess metal over UTM dielectric 58, leaving UTM lines 64 in UTM openings 62, contact plugs 66 in capacitor contact openings 54, and vias 68 in via openings 56. Throughout the description, the term "UTM layer" refers to the collection of all UTM lines 64 in UTM dielectric 58. In an embodiment, UTM lines 64 form an inductor. A top view of a resulting inductor 70 is shown in FIG. 9, wherein inductor 70 includes coiled UTM lines 64.

Figure 8:
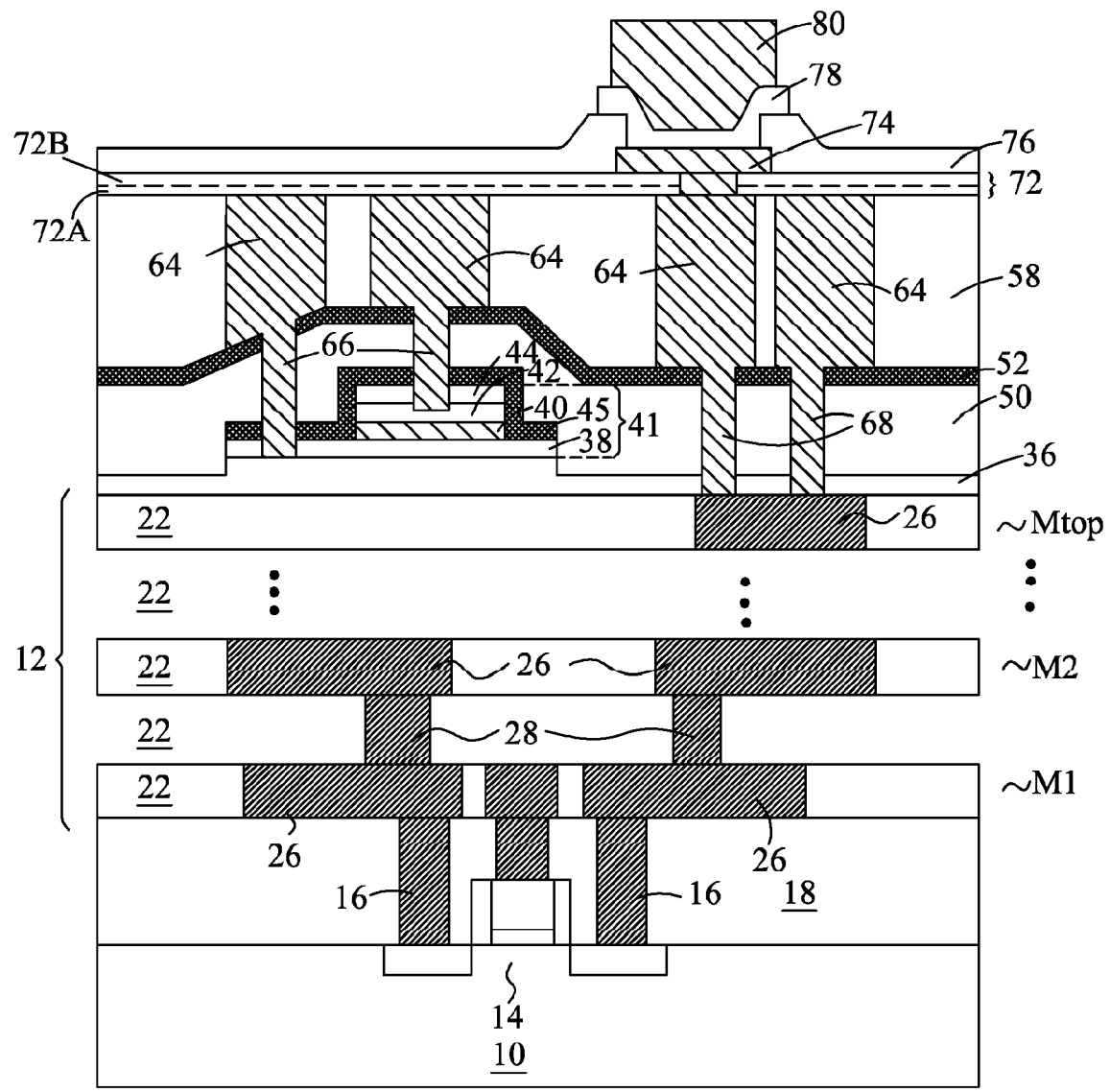

Referring to FIG. 8, the structures over UTM dielectric 58 are formed. The overlying structure may include passivation layer (also referred to as being passivation-1) 72, metal pad 74 (which may be electrically coupled to UTM lines 64), and passivation layer (also referred to as being passivation-2) 76. In an embodiment, passivation layer 72 is formed of silicon oxide layer 72A and silicon nitride layer 72B over silicon oxide layer 72A. The bottom surface of passivation layer 72, which may be the bottom surface of silicon oxide layer 72A, may contact UTM lines 64. Metal pad 74 may comprise aluminum, aluminum copper, tungsten, and/or the like. Passivation layer 76 may be formed of polyimide, silicon oxide, silicon nitride, and/or the like. Passivation layer 76 may have an opening, through which metal pad 74 is exposed. Under-bump metallurgy (UBM) 78 extends into the opening in passivation layer 76. Furthermore, metal bump 80, which may be a solder bump or a bump comprising copper, nickel, palladium, and/or the like, is formed on UBM 78.

It is observed that the top metal layer Mtop has a lower metal density than the underlying layers. Accordingly, there is no need to form metal lines directly under MIM capacitor 41 and in metal layer Mtop. The adverse effect to MIM capacitor 41 caused by the parasitic capacitance between MIM capacitor 41 and the underlying metal lines is thus reduced without affecting the ability to route the underlying metal lines.

In accordance with embodiments, a plurality of metal layers includes a top metal layer. An UTM layer is disposed over the top metal layer, wherein no additional metal layer is located between the UTM layer and the top metal layer. A MIM capacitor is disposed under the UTM layer and over the top metal layer.

In accordance with other embodiments, a device includes a top metal layer; an UTM layer over the top metal layer, wherein a ratio of a first thickness of the UTM layer to a second thickness of the top metal layer is greater than about 5; a via-dielectric layer over the top metal layer and under the UTM layer; and a MIM capacitor under the UTM layer and over the top metal layer. The via-dielectric layer includes a first portion level with the MIM capacitor, and a second portion extending over and vertically overlapping the MIM capacitor. A via is in the via-dielectric layer and contacting a first metal line in the UTM layer and a second metal line in the top metal layer. A capacitor contact plug is in the via-dielectric layer and electrically connected to the MIM capacitor.

In accordance with yet other embodiments, a device includes a top metal layer; a first etch stop layer over the top metal layer; a MIM capacitor over the first etch stop layer; a via-dielectric layer comprises a first portion level with the MIM capacitor, and a second portion over and vertically overlapping the MIM capacitor; a via and a contact plug in the via-dielectric layer and electrically connected to a metal line in the top metal layer and the MIM capacitor, respectively; a second etch stop layer over the via-dielectric layer; an UTM dielectric layer over the second etch stop layer; and a first and a second UTM metal line in the UTM dielectric layer and electrically connected to the via and the contact plug, respectively.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for forming a capacitor comprising:
   forming a Metal-Insulator-Metal (MIM) capacitor over a top metal layer of a plurality of metal layers in a semiconductor device;
   conformably depositing a via-dielectric layer over the MIM capacitor and the top metal layer, wherein the via-dielectric layer comprises a planar first portion having a top surface level with a top surface of the MIM capacitor and a second portion over and vertically overlapping the MIM capacitor; and
   forming an Ultra-Thick Metal (UTM) layer over the dielectric layer.

2. The method of claim 1, wherein a ratio of a thickness of the UTM layer to a thickness of the top metal layer is greater than about 3.

3. The method of claim 1, wherein forming the UTM layer comprises forming the UTM layer to have a thickness greater than about 20 kÅ.

4. The method of claim 1 wherein forming the UTM layer comprises:
   forming a UTM dielectric layer over the MIM capacitor and the top metal layer;
   patterning first and second openings in the dielectric layer and the UTM dielectric layer, exposing a capacitor top metal (CTM) and a capacitor bottom metal (CBM) of the MIM capacitor, respectively; and
   filling the first and second openings with a metallic material.

5. The method of claim 1 further comprising forming a passivation layer over metal lines in the UTM layer.

6. The method of claim 5, wherein forming the passivation layer comprises:
   forming a silicon oxide layer contacting the metal lines in the UTM layer; and
   forming a silicon nitride layer over and contacting the silicon oxide layer.

7. The method of claim 1, wherein forming the UTM layer comprises patterning metal lines in the UTM layer as an inductor.

8. The method of claim 1, further comprising forming an etch stop layer between the top metal layer and the UTM layer.

9. The method of claim 8, wherein the etch stop layer comprises a first portion over and vertically overlapping the MIM capacitor, and a second portion vertically misaligned to any MIM capacitor, and wherein a top surface of the first portion is higher than a top surface of the second portion.

10. A method for forming a capacitor in a semiconductor device comprising:
    providing a plurality of metal layers having a top metal layer;
    forming a Metal-Insulator-Metal (MIM) capacitor over the top metal layer;
    conformably depositing a via-dielectric layer over the MIM capacitor and the top metal layer, wherein the via-dielectric layer comprises a planar first portion having a top surface level with the MIM capacitor, and a second portion extending over and vertically overlapping the MIM capacitor;
    forming an Ultra-Thick Metal (UTM) layer over the via-dielectric layer, wherein a ratio of a first thickness of the UTM layer to a second thickness of the top metal layer is greater than about 3;
    exposing a first metal line in the top metal layer and the MIM capacitor by patterning first and second openings in the via-dielectric layer and the UTM layer, respectively; and
    forming first and second vias in the via-dielectric layer connected to second and third metal lines in the UTM layer, respectively, by filling the first and second openings with a metallic material.

11. The method of claim 10 further comprising forming a first passivation layer over and contacting the second and third metal lines in the UTM layer, wherein the first passivation layer comprises silicon oxide.

12. The method of claim 11 further comprising forming a second passivation layer over and contacting the first passivation layer, wherein the second passivation comprises silicon nitride.

13. The method of claim 10, wherein the first thickness is greater than about 20 kÅ.

14. The method of claim 10 further comprising patterning metal lines in the UTM layer as an inductor.

15. The method of claim 10, further comprising forming an etch stop layer between the top metal layer and the UTM layer.

16. The method of claim 15, wherein forming the etch stop layer comprises forming the etch stop layer to have a first portion over and vertically overlapping the MIM capacitor, and a second portion not over and vertically overlapping any MIM capacitor, and wherein a top surface of the first portion is higher than a top surface of the second portion.

17. A method for forming a capacitor comprising:
    providing a plurality of metal layers having a top metal layer;
    forming a first etch stop layer over the top metal layer;
    forming a Metal-Insulator-Metal (MIM) capacitor over the first etch stop layer;
    conformably depositing a via-dielectric layer over the top metal layer and the MIM capacitor, wherein the via dielectric layer comprises a planar first portion having a top surface level with a top surface of the MIM capacitor, and a second portion over and vertically overlapping the MIM capacitor;
    forming a second etch stop layer over the via-dielectric layer;
    forming an Ultra-Thick Metal (UTM) dielectric layer over the second etch stop layer;
    patterning first and second openings in the UTM dielectric layer, the second etch stop layer, and the via-dielectric layer, exposing a metal line in the top metal layer and the MIM capacitor, respectively; and
    filling the first and second openings with a metallic material forming a via and a contact plug in the via-dielectric layer electrically connected to first and second UTM metal lines in the UTM dielectric layer and electrically connected to the via and the contact plug, respectively.

18. The method of claim 17, wherein a ratio of a first thickness of the first and the second UTM metal lines to a second thickness of the metal line in the top metal layer is greater than about 3.

19. The method of claim 18, wherein the first thickness is greater than about 30 kÅ.

20. The method of claim 17 further comprising:
    forming a first passivation layer over and contacting the first and the second metal lines in the UTM layer, wherein the first passivation layer comprises silicon oxide; and forming a second passivation layer over and contacting the first passivation layer, wherein the second passivation layer comprises silicon nitride.

\* \* \* \* \*